(12) United States Patent
Nishimata et al.

(10) Patent No.: US 12,154,739 B2
(45) Date of Patent: Nov. 26, 2024

(54) POWER DISTRIBUTION DEVICE

(71) Applicant: DENSO CORPORATION, Kariya (JP)

(72) Inventors: Tatsuki Nishimata, Kariya (JP);
Takashi Kawashima, Kariya (JP);
Hajime Oyanagi, Kariya (JP)

(73) Assignee: DENSO CORPORATION, Kariya (JP)

( * ) Notice: Subject to any disclaimer, the term of this patent is extended or adjusted under 35 U.S.C. 154(b) by 231 days.

(21) Appl. No.: 17/964,163

(22) Filed: Oct. 12, 2022

(65) Prior Publication Data

US 2023/0034353 A1 Feb. 2, 2023

Related U.S. Application Data

(63) Continuation of application No. PCT/JP2021/007126, filed on Feb. 25, 2021.

(30) Foreign Application Priority Data

Apr. 15, 2020 (JP) .................................. 2020-073051

(51) Int. Cl.
| | |
|---|---|
| *H01H 45/12* | (2006.01) |
| *B60R 16/03* | (2006.01) |
| *H01H 45/14* | (2006.01) |
| *H02J 7/14* | (2006.01) |
| *H05K 7/20* | (2006.01) |

(52) U.S. Cl.
CPC ............ *H01H 45/12* (2013.01); *H01H 45/14* (2013.01); *H05K 7/20927* (2013.01); *B60R 16/03* (2013.01); *H02J 7/143* (2020.01); *H02J 7/1492* (2013.01)

(58) Field of Classification Search
CPC ........... H05K 7/20254; H05K 7/20472; H05K 7/20854; H05K 7/20872; H05K 7/209; H05K 7/20927; B60R 16/03; H01H 45/12; H01H 45/14; H02J 7/1492; H02J 7/143
See application file for complete search history.

(56) References Cited

U.S. PATENT DOCUMENTS

| | | | | |
|---|---|---|---|---|
| 4,060,847 A | * | 11/1977 | Penrod ................... | H05K 7/209 174/16.3 |
| 7,193,841 B2 | * | 3/2007 | Kita ....................... | H05K 7/026 361/641 |
| 10,637,224 B2 | * | 4/2020 | Hiramitsu ............... | H05K 7/20 |

(Continued)

FOREIGN PATENT DOCUMENTS

WO 2016/006318 A1 1/2016

*Primary Examiner* — Zachary Pape
(74) *Attorney, Agent, or Firm* — Oliff PLC

(57) ABSTRACT

A power distribution device has a resin part covering a portion of a power line and a portion of a signal line and having a switch adjacent to one surface of the resin part, and a cooling part disposed adjacent to a back surface of the resin part opposite to the one surface. The power line and the signal line each have, inside the resin part, a laid-out portion extending in a planar direction orthogonal to an arrangement direction in which the one surface and the back surface are arranged, and a led-out portion extending from the laid-out portion toward the one surface. The laid-out portion of the power line and the laid-out portion of the signal line are located in a projection area of the cooling unit projected in the arrangement direction, and are separated from each other and arranged in the arrangement direction.

7 Claims, 4 Drawing Sheets

(56) References Cited

U.S. PATENT DOCUMENTS

| | | | |
|---|---|---|---|
| 10,881,029 B2* | 12/2020 | Won | H05K 7/06 |
| 10,971,914 B2* | 4/2021 | Fujimura | H05K 1/0204 |
| 11,276,536 B2* | 3/2022 | Won | H05K 3/285 |
| 11,420,572 B2* | 8/2022 | Won | H01H 50/047 |
| 11,562,869 B2* | 1/2023 | Ikejiri | H01M 10/66 |
| 2019/0318892 A1 | 10/2019 | Ikejiri et al. | |
| 2020/0168419 A1 | 5/2020 | Fujimura et al. | |

* cited by examiner

POWER DISTRIBUTION DEVICE

CROSS REFERENCE TO RELATED APPLICATION

The present application is a continuation application of International Patent Application No. PCT/JP2021/007126 filed on Feb. 25, 2021, which designated the U.S. and claims the benefit of priority from Japanese Patent Application No. 2020-073051 filed on Apr. 15, 2020. The entire disclosures of all of the above applications are incorporated herein by reference.

TECHNICAL FIELD

The disclosure of this specification relates to a power distribution device.

BACKGROUND

It has been known a relay unit including a base member, a control bus bar, a bus bar, a relay, and a fan.

In such a relay unit, the control bus bar may be arranged adjacent to a back surface of the base member. On the contrary, the relay, the bus bar and the fan may be mounted adjacent to a front surface of the base member. In such a configuration, however, the size of the relay unit in a direction orthogonal to the front surface of the base member is likely to increase.

SUMMARY

The present disclosure describes a power distribution device in which an increase in size is suppressed.

DETAILED DESCRIPTION

Figure 1:
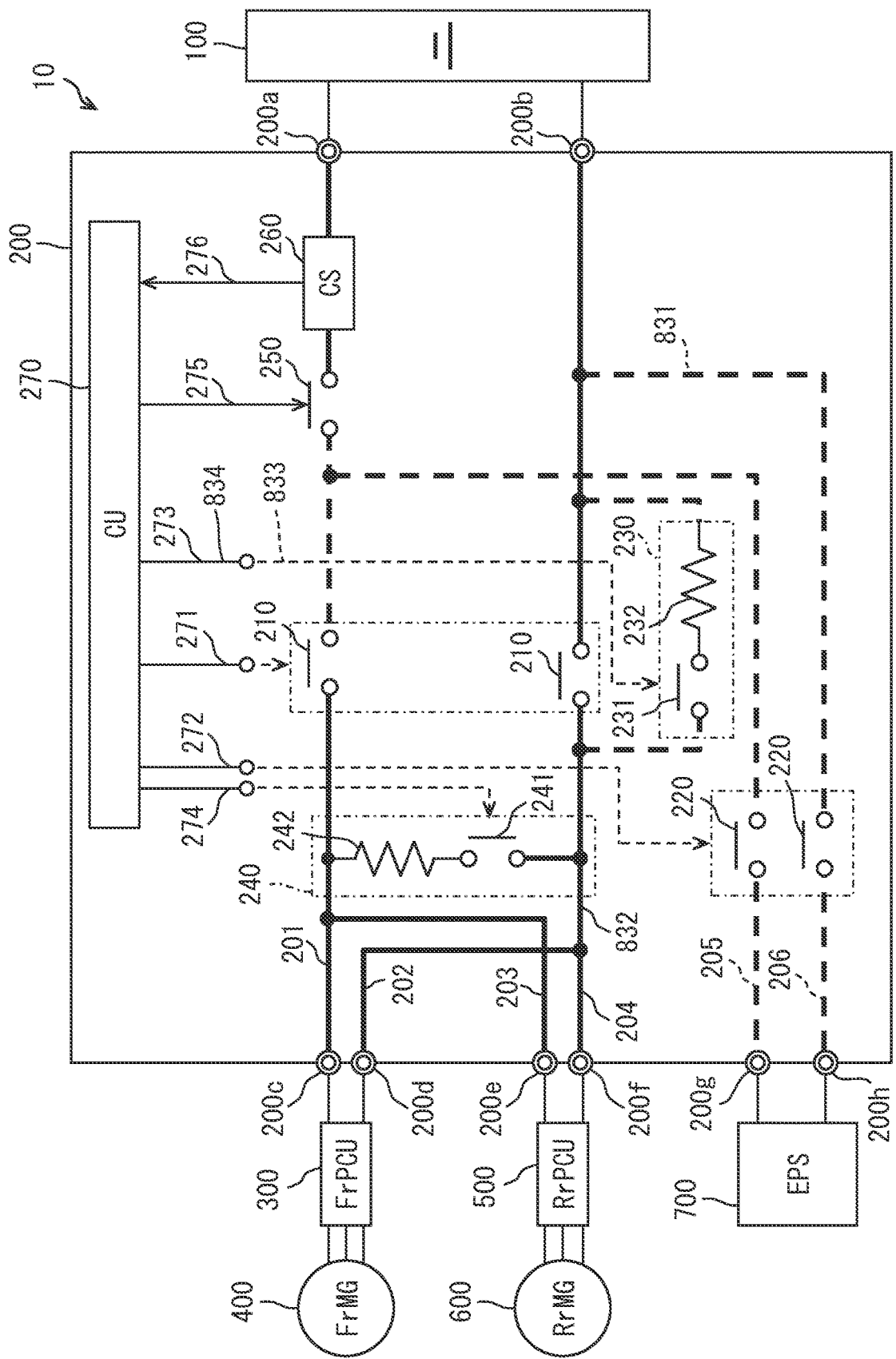
FIG. 1 is a circuit diagram for explaining a power supply system.

A power distribution device according to an aspect of the present disclosure includes: a switch, a control unit, a power line, a signal line, a resin part, and a cooling part. The switch is configured to control conduction and interception of a supplied power between a power supply and an electrical load. The control unit is configured to control on and off of the switch according to a control signal having a voltage lower than the supplied power. The power line is disposed to allow the supplied power to flow. The signal line is disposed to allow the control signal to flow. The resin part covers a part of the power line and a part of the signal line and in which the switch is arranged adjacent to one surface of the resin part. The cooling part is arranged adjacent to a back surface of the resin part on a back side of the one surface.

Further, each of the power line and the signal line has, inside the resin part, a laid-out portion extending in a planar direction orthogonal to an arrangement direction in which the one surface and the rear surface are arranged, and a led-out portion extending from the laid-out portion toward the one surface. The laid-out portion of the power line and the laid-out portion of the signal line are located in an projection area of the cooling part defined by projecting the cooling part in the arrangement direction, and are separated from each other and arranged in the arrangement direction.

In such a configuration, the increase in size of the power distribution device in the planar direction is suppressed.

The following will describe embodiments for carrying out the present disclosure with reference to the drawings. In each embodiment, parts corresponding to the elements described in the preceding embodiments are denoted by the same reference numerals, and redundant explanation may be omitted. In an embodiment, when only a part of the configuration is described, the other parts of the embodiment can be provided by the configurations of the embodiments described so far.

When, in each embodiment, it is specifically described that combination of parts is possible, the parts can be combined. In a case where any obstacle does not especially occur in combining the parts of the respective embodiments, it is possible to partially combine the embodiments, the embodiment and the modification, or the modifications even when it is not explicitly described that combination is possible.

(First Embodiment)

A power distribution device according to a present embodiment will be described with reference to FIGS. 1 to 4. The power distribution device is applied to an electric vehicle such as a battery electric vehicle and a plug in hybrid electric vehicle. In the present embodiment, a configuration in which the power distribution device is applied to the battery electric vehicle is described as an example.

<Power Supply System>

As shown in FIG. 1, a power distribution device 200 is included in a power supply system 10 of a vehicle. The power supply system 10 includes a battery pack 100, a front PCU 300, a front MG 400, a rear PCU 500, and a rear MG 600, in addition to the power distribution device 200. An external power source 700 is connected to the power supply system 10.

Note that PCU is an abbreviation of a power control unit. MG is an abbreviation of a motor generator. In the drawings, the front PCU 300 is indicated as FrPCU. The front MG 400 is indicated as FrMG. The rear PCU 500 is indicated as RrPCU. The rear MG 600 is indicated as RrMG. The external power supply 700 is indicated as EPS.

The battery pack 100 and the external power supply 700 correspond to power supplies. The front PCU 300, the front MG 400, the rear PCU 500, and the rear MG 600 correspond to electrical loads.

In the vehicle, the battery pack 100 and the power distribution device 200 are electrically connected to each other through a wire harness or the like, which is provided as a power supply path. The front PCU 300 and the rear PCU 500 are electrically connected to the power distribution device 200 via wire harnesses or the like. The front MG 400 is electrically connected to the front PCU 300. The rear MG 600 is electrically connected to the rear PCU 500. Due to such an electrical connection configuration, DC electric power output from the battery pack 100 is supplied to the front PCU 300 and the rear PCU 500 via the power distribution device 200.

Each of the front PCU 300 and the rear PCU 500 includes an inverter circuit and/or a converter circuit for performing power transformation. Each of the front PCU 300 and the rear PCU 500 converts a supplied DC electric power into an AC electric power. On the contrary, each of the front PCU 300 and the rear PCU 500 converts a supplied AC electric power into a DC electric power.

The front MG 400 and the rear MG 600 are motor generators for traveling the vehicle to make the vehicle running. The front MG 400 and the rear MG 600 are powered by the AC electric power supplied from the front PCU 300 and the rear PCU 500. The front MG 400 generates power to rotate a front wheel of the vehicle. The rear MG 600 generates power to rotate a rear wheel of the vehicle.

The front MG 400 and the rear MG 600 regeneratively generate electricity by receiving the propulsive force of the vehicle. The AC electric power generated by this regenerative power generation is converted into a DC electric power by the front PCU 300 and the rear PCU 500. This DC electric power is supplied to battery pack 100 via the power distribution device 200.

The external power source 700 is externally connected to the power distribution device 200. A DC charging power output from the external power source 700 is supplied to the battery pack 100. As a result, the battery pack 100 is charged.

As described above, the power distribution device 200 supplies the DC electric power (source power) supplied from the battery pack 100 to the PCU. The power distribution device 200 supplies electric power (regenerative power) generated by regenerative power generation by the MG and converted into the DC electric power by the PCU to the battery pack 100. The power distribution device 200 supplies charging power supplied from the external power source 700 to the battery pack 100. The power distribution device 200 also supplies these electric powers to the various electrical loads (not shown). The source power, the regenerative power, and the charging power correspond to supplied power. The components of the power distribution device 200 will be individually described hereinafter.

<Power Distribution Device>

The power distribution device 200 has first to sixth power lines 201 to 206, as power feed lines. The power distribution device 200 has a main switch 210, a power supply switch 220, a pre-charge circuit 230, a discharge circuit 240, a pyro-switch 250, and a current sensor 260 as electrical components provided on these power lines. The power distribution device 200 also has a control unit 270 that controls electrical conduction and interception of the currents in these switches.

In the drawings, the current sensor 260 is indicated as CS. The control unit 270 is indicated as CU. The main switch 210, the power supply switch 220, and the pyro-switch 250 correspond to switches. The control unit 270 corresponds to a control portion.

The first power line 201 has a first connection terminal 200 at one end. The second power line 202 has a second connection terminal 200b at one end. The battery pack 100 is connected to the first connection terminal 200a and the second connection terminal 200b. Specifically, a negative electrode of the battery pack 100 is connected to the first connection terminal 200a. A positive electrode of the battery pack 100 is connected to the second connection terminal 200b.

A main switch 210 is provided on each of the first power line 201 and the second power line 202. A third connection terminal 200c is provided at the other end of the first power line 201. A fourth connection terminal 200d is provided at the other end of the second power line 202. The front PCU 300 is connected to the third connection terminal 200c and the fourth connection terminal 200d. The pyro-switch 250 is provided on the first power line 201. The pyro-switch 250 is in an electrically conducted state when the power distribution device 200 is normal.

Due to such an electrical connection configuration, the battery pack 100 and the front PCU 300 are electrically connected to each other when the main switch 210 is in the electrically conducted state. An electrical load (not shown) is electrically connected to the third connection terminal 200c and the fourth connection terminal 200d. Examples of the electrical load include AC-DC converters, DC-DC converters, vehicle accessories, and the like.

One end of the third power line 203 is connected to a middle point between the third connection terminal 200c and the main switch 210 on the first power line 201. One end of the fourth power line 204 is connected to a middle point between the fourth connection terminal 200d and the main switch 210 on the second power line 202.

A fifth connection terminal 200e is provided at the other end of the third power line 203. A sixth connection terminal 200f is provided at the other end of the fourth power line 204. The rear PCU 500 is connected to the fifth connection terminal 200e and the sixth connection terminal 200f.

Due to such an electrical connection configuration, the battery pack 100 and the rear PCU 500 are electrically connected to each other when the main switch 210 is turned on.

One end of the fifth power line 205 is connected to the middle point between the first connection terminal 200a and the main switch 210 on the first power line 201. One end of the sixth power line 206 is connected to the middle point between the second connection terminal 200b and the main switch 210 on the second power line 202.

A power supply switch 220 is provided on each of the fifth power line 205 and the sixth power line 206. A seventh connection terminal 200g is provided at the other end of the fifth power line 205. An eighth connection terminal 200h is provided at the other end of the sixth power line 206. The external power supply 700 is connected to the seventh connection terminal 200g and the eighth connection terminal 200h.

Due to such an electrical connection configuration, the external power supply 700 and the battery pack 100 are electrically connected to each other when the power supply switch 220 is turned on. Furthermore, the external power supply 700 and the PCU are electrically connected to each other when the main switch 210 is turned on.

Each of the main switch 210 and the power supply switch 220 is a mechanical switch element. The main switch 210 is a normally closed switching element that is turned off according to an input of a drive signal generated from the control unit 270 and turned on according to an interception of the input of the drive signal. The power supply switch 220 is a normally open switching element that is turned on according to an input of a drive signal generated from the control unit 270 and turned off according to an interception of the input of the drive signal.

The pre-charge circuit 230 has a charging switch 231 and a charging resistor 232 connected in series. The pre-charge circuit 230 is connected in parallel with the main switch 210 provided on the second power line 202.

The front PCU 300 and the rear PCU 500 electrically connected to the second power line 202 each include a large-capacity smoothing capacitor. One of the two electrodes of each smoothing capacitor is electrically connected to the first power line 201 and the other is electrically connected to the second power line 202.

The smoothing capacitor is used in a charged state. In a case where the smoothing capacitor is charged, the charging switch 231 and the main switch 210 of the first power line 201 are turned on while the main switch 210 of the second power line 202 is turned off. By doing so, electric power is supplied from the battery pack 100 to the smoothing capacitor via the charging resistor 232. By allowing the electric charges to flow through the charging resistor 232 in this manner, a rapid increase in the amount of current flowing from the battery pack 100 to the smoothing capacitor is suppressed.

The discharge circuit 240 has a discharging switch 241 and a discharging resistor 242 connected in series. The discharge circuit 240 connects the first power line 201 and the second power line 202. One end of the discharge circuit 240 is connected to a middle point between the connection point of the third power line 203 on the first power line 201 and the main switch 210. The other end of the discharge circuit 240 is connected to the middle point between the connection point of the fourth power line 204 on the second power line 202 and the main switch 210.

As described above, the smoothing capacitor is charged when in use. However, the electric charges accumulated in the smoothing capacitor are unnecessary when not in use. In order to discharge the electric charges, the discharging switch 241 is turned on while the main switch 210 and the charging switch 231 are turned off. As a result, a closed loop including the discharging resistor 242 and the smoothing capacitor is formed. The discharging resistor 242 and the smoothing capacitor are connected in series. As a result, the electric charges accumulated in the smoothing capacitor flow through the discharging resistor 242. By allowing the electric charges to flow through the discharging resistor 242 in this manner, the electric charges accumulated in the smoothing capacitor are gradually discharged.

The pyro-switch 250 is provided between the connection point of the fifth power line 205 on the first power line 201 and the first connection terminal 200a. The pyro-switch 250 is a normally closed switch. The pyro-switch 250 is turned off when an abnormality occurs in the power distribution device 200.

The pyro-switch 250 is specifically an explosive. When an abnormality occurs, the pyro-switch 250 is exploded and intercepts the electrical conduction of the first power line 201. As the pyro-switch 250 has such a property, the pyro-switch 250 is a disposable electrical component.

The current sensor 260 is provided between the pyro-switch 250 and the first connection terminal 200a on the first power line 201. The current sensor 260 functions to detect the electric current flowing through the first power line 201.

The power distribution device 200 has first to fifth signal lines 271 to 275 as output lines for control signals of the control unit 270, and a sixth signal line 276 as an output line for sensor information.

As shown in FIG. 1, one end of each of the first to sixth signal lines 271 to 276 is connected to the control unit 270. The other end of the first signal line 271 is connected to the main switch 210. The other end of the second signal line 272 is connected to the power supply switch 220. The other end of the third signal line 273 is connected to the charging switch 231. The other end of the fourth signal line 274 is connected to the discharging switch 241. The other end of the fifth signal line 275 is connected to the pyro-switch 250. The other end of the sixth signal line 276 is connected to the current sensor 260.

Due to the connection configurations described above, the control unit 270 is electrically connected to the main switch 210, the power supply switch 220, the charging switch 231, the discharging switch 241, the pyro-switch 250, and the current sensor 260, respectively. Also, the control unit 270 communicates with an in-vehicle ECU via a wiring (not shown).

The control unit 270 controls on and off of various switches included the power distribution device 200 in accordance with the communication with the in-vehicle ECU, vehicle signals including vehicle information received from in-vehicle sensors (not shown), and the electric current value received from the current sensor 260. That is, the control unit 270 controls the electrical conduction and interception of various switches.

<Switch Control>

When an abnormality occurs in the power distribution device 200, the control unit 270 turns off the pyro-switch 250. That is, the control unit 270 explodes the pyro-switch 250. As a result, the power supply through the power distribution device 200 is intercepted. Note that the pyro-switch 250 is in an electrically conducted state in the control of the other switches described hereinafter. Therefore, the description of the control of the pyro-switch 250 is omitted hereinafter.

When charging the smoothing capacitor, the control unit 270 turns on the charging switch 231 and the main switch 210 of the first power line 201. The control unit 270 turns off the main switch 210 on the second power line 202, the power supply switch 220, and the discharging switch 241. As a result, the source power from the battery pack 100 is supplied to the smoothing capacitor via the charging resistor 232. Note that the charging switch 231 is in the off state in the control of the other switches described hereinafter. Therefore, the description of the control of the charging switch 231 is omitted hereinafter.

When discharging the smoothing capacitor, the control unit 270 turns on the discharging switch 241. The control unit 270 turns off the main switch 210 and the power supply switch 220. As a result, the electric charges accumulated in the smoothing capacitor flow through the discharging resistor 242. Note that the discharging switch 241 is in the off state in the control of the other switch described hereinafter. Therefore, the description of the control of the discharging switch 241 is omitted hereinafter.

When the vehicle is parked, stopped, or driven for normally travelling, the control unit 270 turns on the main switch 210 and turns off the power supply switch 220. As a result, the source power from the battery pack 100 is supplied to the front PCU 300 and the rear PCU 500. On the contrary, the regeneration powers of the front MG 400 and the rear MG 600 are supplied to the battery pack 100. In addition, these electric powers are supplied to the electrical loads mounted on the vehicle.

During the charging by connecting the external power source 700 to the power distribution device 200 in a parked and stopped state, the control unit 270 turns on the power supply switch 220. As a result, the charging power of the external power supply 700 is supplied to the battery pack 100. When the control unit 270 turns on the main switch 210, the charging power is supplied to the front PCU 300, the rear PCU 500, and the electrical loads.

<Structure of Power Distribution Device>

Next, the configuration of the power distribution device 200 will be described with reference to FIGS. 2 to 4. Note that, in each drawing, the configuration of the power distribution device 200 is schematically shown.

In the following, the three directions orthogonal to each other are referred to as an "x" direction, a "y" direction, and a "z" direction. In the drawings, the term "direction" is omitted, and the respective directions are simply indicated as x, y, and z. The z direction corresponds to an arrangement direction. A direction orthogonal to the z direction corresponds to a planar direction.

Figure 2:
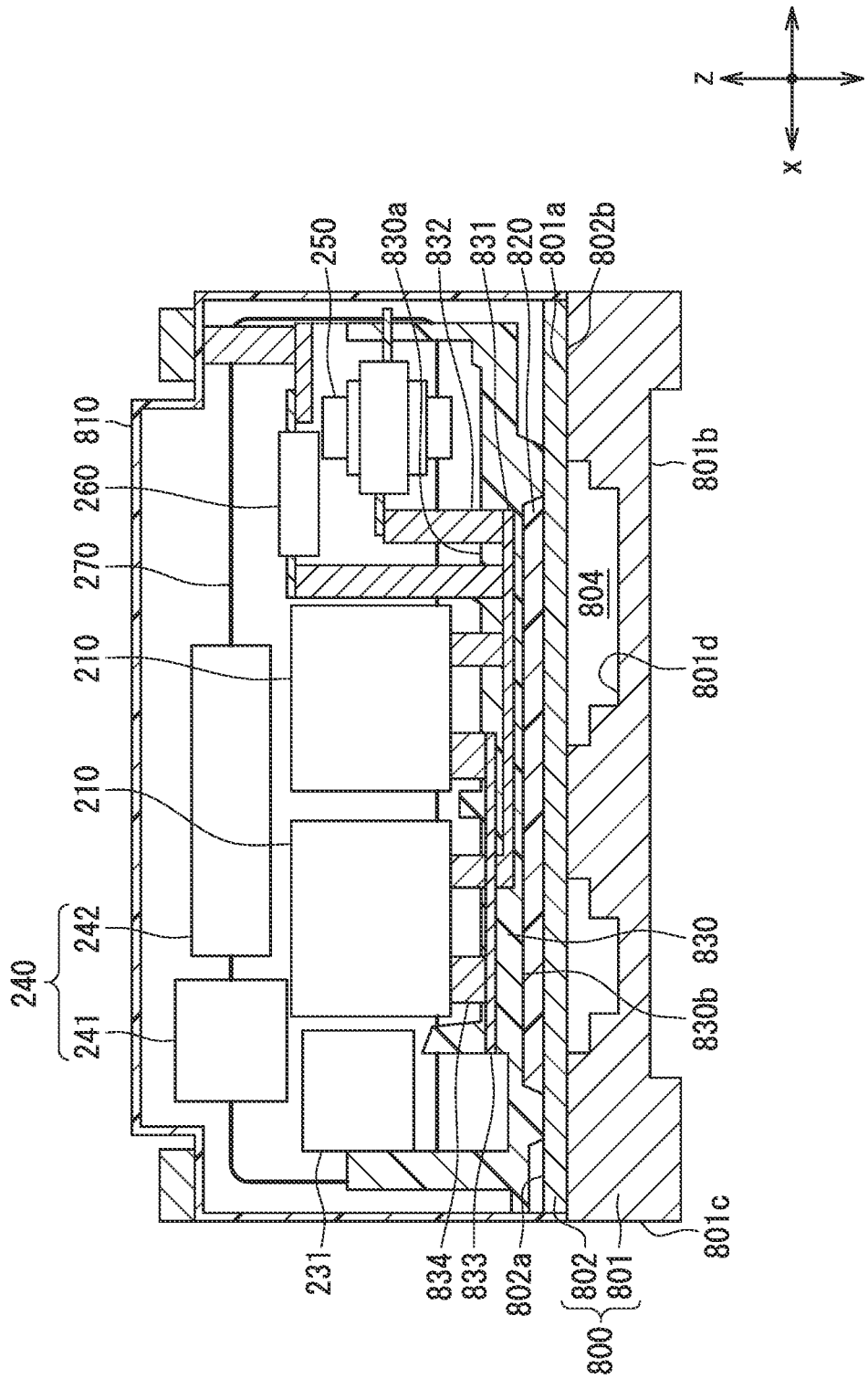
FIG. 2 is a cross-sectional view for explaining a power distribution device according to a first embodiment.

As shown in FIG. 2, the power distribution device 200 has a support body 800, a cover 810, a heat transfer sheet 820, and a resin part 830, in addition to the various components shown in FIG. 1. The cover 810 is connected to the support body 800 to provide a storage space therebetween. In this storage space, the heat transfer sheet 820 and the resin part 830 are stored together with the various components of the power distribution device 200 shown in FIG. 1. The first to eighth connection terminals 200a to 200h shown in FIG. 1 are provided outside of this storage space. Alternatively, a configuration in which at least one of these eight connection terminals is provided inside the storage space can be adopted.

The support body 800 has a base part 801 and a floor part 802. The base part 801 is produced by aluminum die casting, for example. The floor part 802 is made of aluminum, for example.

The base part 801 has an inner wall surface 801a and an outer wall surface 801b arranged but separate from each other in the z direction. The base part 801 also has a side wall surface 801c connecting these inner and outer wall surfaces 801a and 801b. The base part 801 is formed with a groove portion 801d that is selectively recessed from the inner wall surface 801a toward the outer wall surface 801b. The thickness of the base part 801 in the z direction is uneven due to the groove portion 801d.

The floor part 802 has a flat shape with a thin thickness in the z direction. The floor part 802 has an upper surface 802a and a lower surface 802b arranged apart from each other in the z direction. The floor part 802 is provided adjacent to the inner wall surface 801a of the base part 801 so as to cover the space defined by the groove portion 801d. The floor part 802 is arranged to face the base part 801 in such a manner that the lower surface 802b and the inner wall surface 801a are in contact with each other in the z direction. As a result, a portion of the lower surface 802b and a wall surface defining the groove portion 801d are arranged to face each other while being spaced apart from each other in the z direction. In this faced arrangement state, the floor part 802 is mechanically connected to the base part 801 by welding or the like.

Between the floor part 802 and the base part 801 welded to each other, a channel 804 is provided for the flow of cooling fluid therebetween. The channel 804 is composed of the lower surface 802b and the wall surface defining the groove portion 801d, which are spaced apart in the z-direction and face each other. The portion of the lower surface 802b that forms the channel 804 may adopt a flat shape as shown in FIG. 2, or may adopt a configuration with multiple projections so as to increase a contact area with the cooling fluid. The channel 804 has an outlet port that opens on any of the side wall surface 801c, the inner wall surface 801a, and the outer wall surface 801b. The channel 804 corresponds to a cooling part.

The heat transfer sheet 820 is provided on the upper surface 802a of the floor part 802. The heat transfer sheet 820 is made of an insulating resin material. The heat transfer sheet 820 deforms according to the uneven surface shape of the upper surface 802a and adheres to the upper surface 802a. This close contact reduces the thermal resistance between the heat transfer sheet 820 and the floor part 802.

The resin part 830 integrally connects the plurality of power lines and the plurality of signal lines described hereinabove by partially covering the plurality of power lines and the plurality of signal lines. A portion of each of the power lines and a portion of each of the signal lines are insert-molded in the resin part 830. It is also possible to employ a configuration in which the resin part 830 is composed of a plurality of parts, and the portions of the power lines and the portions of the signal lines are provided between the parts of the resin part 830.

The resin part 830 has a bottom surface 830a and a mounting surface 830b separate from each other in the z direction. The resin part 830 is disposed so that the mounting surface 830b is adjacent to the heat transfer sheet 820. The heat transfer sheet 820 is deformed according to the uneven shape of the mounting surface 830b. As a result, the heat transfer sheet 820 is brought into close contact with the mounting surface 830b. This close contact reduces the thermal resistance between the resin part 830 and the heat transfer sheet 820. The bottom surface 830a corresponds to one surface. The mounting surface 830b corresponds to a back surface.

As described above, the heat transfer sheet 820 is interposed between the resin part 830 and the floor part 802. Each of the resin part 830 and the floor part 802 is in close contact with the heat transfer sheet 820. Therefore, the heat of the resin part 830 is easily transferred to the floor part 802 via the heat transfer sheet 820. Heat transfer from the resin part 830 to the floor part 802 is facilitated by the heat transfer sheet 820.

As shown in FIG. 2, in the storage space, various electric components shown in FIG. 1 are provided in an upper space defined between the bottom surface 830a of the resin part 830 and the cover 810. That is, the main switch 210, the charging switch 231, the discharge circuit 240, the pyro-switch 250, the current sensor 260, and the control unit 270 are provided in the upper space. Although not shown, the power supply switch 220 and the charging resistor 232 are also provided in the upper space.

As described above, the electric currents flow through the various electrical components accommodated in the upper spaces. Therefore, Joule heat is generated in the various electrical components. The Joule heat is transferred to the resin part 830 by heat radiation, heat transfer, heat conduction, or the like. Further, the Joule heat is also generated in the power lines and signal lines covered with the resin part 830. As a result, the temperature of the resin part 830 rises.

As described above, however, the heat of the resin part 830 is easily transferred to the floor part 802 via the heat transfer sheet 820. This heat is transferred to the cooling liquid flowing through the channel 804. Furthermore, the heat transferred to the cooling liquid is transferred to the external atmosphere via the base part 801. Such heat transfer (radiation) suppresses the temperature rise of the resin part 830. In addition, an increase in temperature of the various electrical components stored in the upper space can also be suppressed by the heat transfer to the resin part 830, whose temperature rise is suppressed.

<Power Lines and Signal Lines>

As described above, the resin part 830 partially covers the power lines and the signal lines. In the following description, a portion of the power line partially covered with the resin part 830 is referred to as a covered power line 831 and a portion of the power line that is not covered with the resin part 830 is referred to as an exposed power line 832 in order to distinguish constituent elements. A portion of the signal line partially covered with the resin part 830 is referred to as a covered signal line 833, and a portion of the signal line that is not covered with the resin part 830 is referred to as an exposed signal line 834.

Each of the covered power line 831, the exposed power line 832, and the covered signal line 833 is provided by a metal bus bar formed by pressing a metal plate. The exposed signal line 834 is an insulated wire.

In FIG. 1, the covered power line 831 and the covered signal line 833 are indicated by broken lines, and the exposed power line 832 and the exposed signal line 834 are indicated by solid lines. As distinguishably shown by the broken lines and the solid lines, each of the first power line 201, the fifth power line 205, and the sixth power line 206 has a covered power line 831. Each of the first power line 201, the third power line 203, and the fourth power line 204 has the exposed power lines 832.

As described above, the first power line 201 is provided with one main switch 210, the pyro-switch 250 and the current sensor 260. The first power line 201 is divided into four sections in order to bridge and electrically connect the one main switch 210, the pyro-switch 250 and the current sensor 260 between the first connection terminal 200a and the third connection terminal 200c. One of the four sections of the first power line 201 is provided by the covered power lines 831 and the remaining three sections are provided by the exposed power lines 832.

The second power line 202 is provided with one main switch 210. The second power line 202 is divided into two sections so as to electrically connect the main switch 210 to the second connection terminal 200b and the fourth connection terminal 200d. Each of the two sections is provided by the exposed power line 832.

The third power line 203 branches and extends from the exposed power line 832 of the first power line 201. The fourth power line 204 branches and extends from the exposed power line 832 of the second power line 202.

The fifth power line 205 is provided with one charging switch 231. The fifth power line 205 is divided into two sections in order to electrically connect the charging switch 231 to the first power line 201 and the seventh connection terminal 200g. Each of the two sections is provided by the covered power line 831.

The sixth power line 206 is provided with one charging switch 231. The sixth power line 206 is divided into two sections in order to electrically connect the charging switch 231 to the second power line 202 and the eighth connection terminal 200h. Each of the two sections is provided by the covered power line 831.

Each of the first to fourth signal lines 271 to 274 has the covered signal line 833 and the exposed signal line 834. The fifth signal line 275 and the sixth signal line 276 have the exposed signal lines 834. Each of the exposed signal lines 834 of these signal lines is connected to the control unit 270.

Although one first signal line 271 is shown in FIG. 1, two first signal lines 271 are actually connected individually and correspondingly to the two main switches 210. The covered signal lines 833 of these two first signal lines 271 are connected to the main switches 210.

Similarly, although one second signal line 272 is shown in FIG. 1, two second signal lines 272 are actually connected to individually and correspondingly to the two charging switches 231. The covered signal lines 833 of these two second signal lines 272 are connected to the charging switches 231.

In addition, the covered signal line 833 of the third signal line 273 is connected to the charging switch 231, and the covered signal line 833 of the fourth signal line 274 is connected to the discharging switch 241. The exposed signal line 834 of the fifth signal line 275 is connected to the pyro-switch 250, and the exposed signal line 834 of the sixth signal line 276 is connected to the current sensor 260.

<Covered Power Line and Covered Signal Line>

Figure 3:
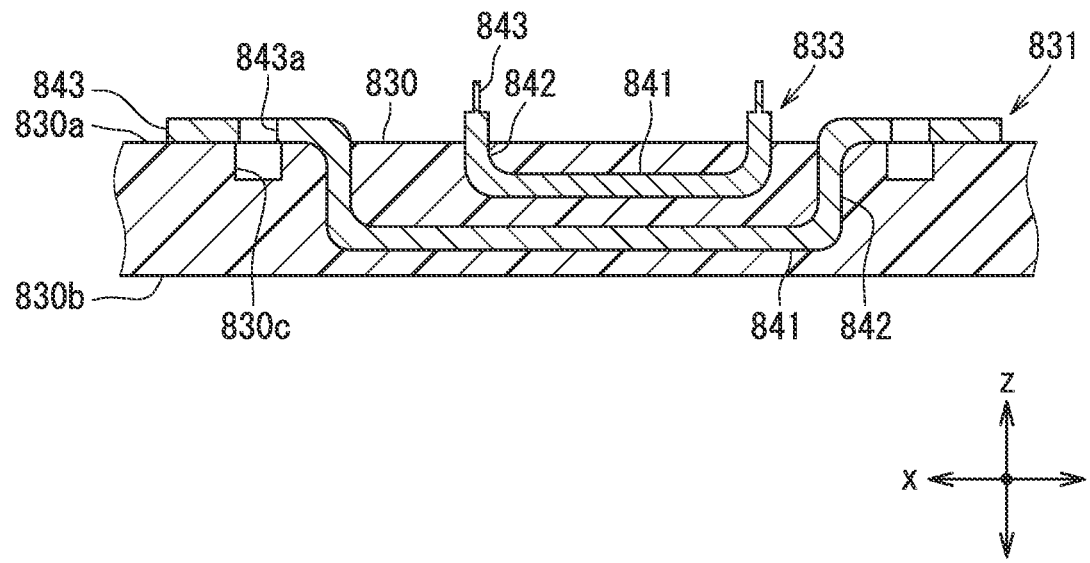
FIG. 3 is a partial cross-sectional view for explaining a resin part.

As schematically shown in FIG. 3, each of the covered power line 831 and the covered signal line 833 includes a laid-out portion 841 and a led-out portion 842 covered with the resin part 830, and a connecting portion 843 exposed from the resin part 830.

The laid-out portion 841 extends in the x direction and the y direction inside of the resin part 830. The led-out portion 842 extends in the z direction from the end of the laid-out portion 841 toward the bottom surface 830a. The connecting portion 843 extends from the end of the led-out portion 842 and is positioned above the bottom surface 830a.

The connecting portion 843 of the covered power line 831 is formed with a bolt hole 843a for bolting the electric component or the exposed power line 832 or functioning as a connection terminal. The bolt hole 843a is open in the z direction. FIG. 4 shows a configuration in which the exposed power line 832 is fixed to the connecting portion 843 with a bolt 844.

The resin part 830 is formed with a recessed portion 830c that is partially recessed from the bottom surface 830a toward the mounting surface 830b. The tip end of a shaft portion of the bolt 844 projecting from the bolt hole 843a is received in the recessed portion 830c. A screwed groove may be formed on a wall surface that defines the recessed portion 830c.

The connecting portion 843 of the covered signal line 833 protrudes in the z direction. As shown in FIG. 4, a connector of the exposed signal line 834 is connected to this protrusion. The covered signal line 833 and the exposed signal line 834 are electrically connected to each other through the connection of the connecting portion 843 and the protrusion.

Incidentally, as schematically shown in FIG. 2, the positions of the electrical components to which the power lines and the signal lines are connected are different in the x direction and the y direction. The laid-out portions 841 of the covered power lines 831 and the laid-out portions 841 of the covered signal lines 833 respectively extend in the x direction and the y direction inside the resin part 830 according to the positions in the x direction and the y direction of the connection objects to which the power lines and the signal lines are connected.

The length of the laid-out portion 841 in its extending direction is longer than the length of the led-out portion 842 in its extending direction as well as the length of the connecting portion 843 in its extending direction. Therefore, the Joule heat generated in the laid-out portion 841 is greater than the Joule heat generated in the led-out portion 842 and the connecting portion 843 respectively.

Figure 4:
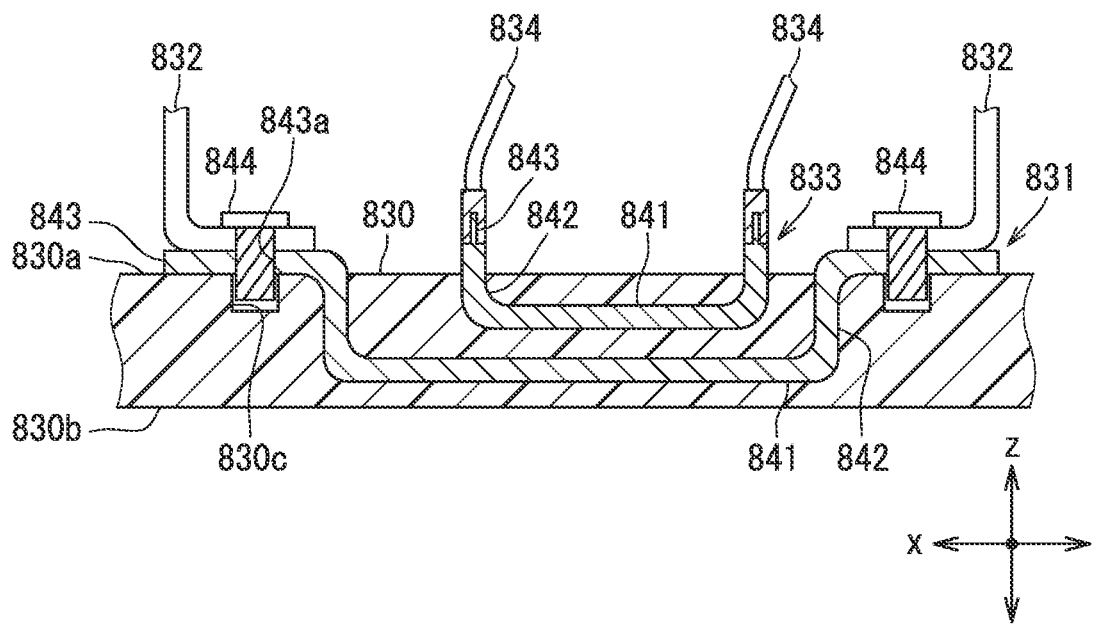
FIG. 4 is a partial cross-sectional view for explaining a connection state of a power line and a signal line.

As clearly shown in FIGS. 2 to 4, the position of the laid-out portion 841 in the z direction in which a large amount of the Joule heat is generated is different between the covered power line 831 and the covered signal line 833. The laid-out portion 841 of the covered power line 831, the laid-out portion 841 of the covered signal line 833, and various electrical components are arranged to each other in the z direction. In a projection area defined by projecting the channel 804 in the z direction, at least a part of each of the laid-out portion 841 of the covered power line 831, the laid-out portion 841 of the covered signal line 833, and various electric components is located.

The length of the laid-out portion 841 of the covered power line 831 in the extending direction is longer than the length of the laid-out portion 841 of the covered signal line 833 in the extending direction. The laid-out portion 841 has a width in a direction orthogonal to both of the extending direction and the z direction. The width of the laid-out portion 841 of the covered power line 831 is greater than the width of the laid-out portion 841 of the covered signal line 833. In regard to an overlapping area of the laid-out portion 841 overlapping the projection area of the channel 804 in the z direction, the covered power line 831 has a larger overlapping area than the covered signal line 833.

The laid-out portion 841 of the covered power line 831 is located adjacent to the mounting surface 830*b* in the z direction. The laid-out portion 841 of the covered signal line 833 is located adjacent to the bottom surface 830*a* in the z direction.

In other words, the laid-out portion 841 of the covered power line 831 is located closer to the channel 804 through which the cooling fluid flows than the laid-out portion 841 of the covered signal line 833 in the z direction. The laid-out portion 841 of the covered power line 831 is farther from the electrical components that generate the Joule heat than the laid-out portion 841 of the covered signal line 833 in the z direction.

<Advantageous Effects>

The laid-out portion 841 of the covered power line 831 and the laid-out portion 841 of the covered signal line 833 are arranged to each other in the z direction. This arrangement suppresses an increase in the size of the power distribution device 200 in the planar direction orthogonal to the z direction.

As described with reference to FIG. 1, the source power, the regenerative power, and the charging power flow through the power lines. The voltage of the electric power flowing through the power lines is about 200 V to 400 V. On the other hand, the control signals flow through the signal lines. The voltage of the control signals flowing through the signal lines is about 0 V, 5 V, or 12 V.

Thus, the voltage applied to the power lines is much higher than the voltage applied to the signal lines. In terms of the unit of volt, the voltage applied to the power lines is ten times or more than the voltage applied to the signal lines. The resin part 830 covers the covered power line 831 of the power line and the covered signal line 833 of the signal line, to which voltages being largely different are applied. The temperature of the covered power line 831 is likely to be higher than the temperature of the covered signal line 833.

In this regard, the laid-out portion 841 of the covered power line 831 is located closer to the mounting surface 830*b* of the resin part 830 than the laid-out portion 841 of the covered signal line 833. In other words, the laid-out portion 841 of the covered power line 831 is located closer to the channel 804 than the laid-out portion 841 of the covered signal line 833. Therefore, the heat generated in the power line is efficiently radiated to the cooling fluid flowing through the channel 804. As such, the temperature rise of the resin part 830 is suppressed. Due to the heat transfer to the resin part 830 whose temperature rise is suppressed, the temperature rises of various electrical components accommodated in the upper space is also suppressed.

The laid-out portion 841 of the covered power line 831 has the overlapping area overlapping the projection area of the channel 804 in the z direction, and the overlapping area of the laid-out portion 841 of the covered power line 831 is larger than that of the laid-out portion 841 of the covered signal line 833. In such a configuration, the heat of the laid-out portion 841 of the covered power line 831 is efficiently dissipated to the cooling fluid flowing through the channel 804.

The connecting portion 843 of the covered power line 831 is formed with the bolt hole 843*a* opening in the z direction. The shaft portion of the bolt 844 can be inserted into the bolt hole 843*a* from the bottom surface 830*a* side toward the mounting surface 830*b* side in the z direction.

Also, the connecting portion 843 of the covered signal line 833 protrudes in the z direction. The connector of the exposed signal line 834 can be connected to the protrusion of the connecting portion 842 from the bottom surface 830*a* side toward the mounting surface 830*b* side in the z direction.

As described above, the work for assembling other components to the connecting portions 843 of the power lines and the signal lines is unified in the direction from the bottom surface 830*a* side toward the mounting surface 830*b* side in the z direction. As such, the assembling work can be simplified.

(Second Embodiment)

Figure 5:
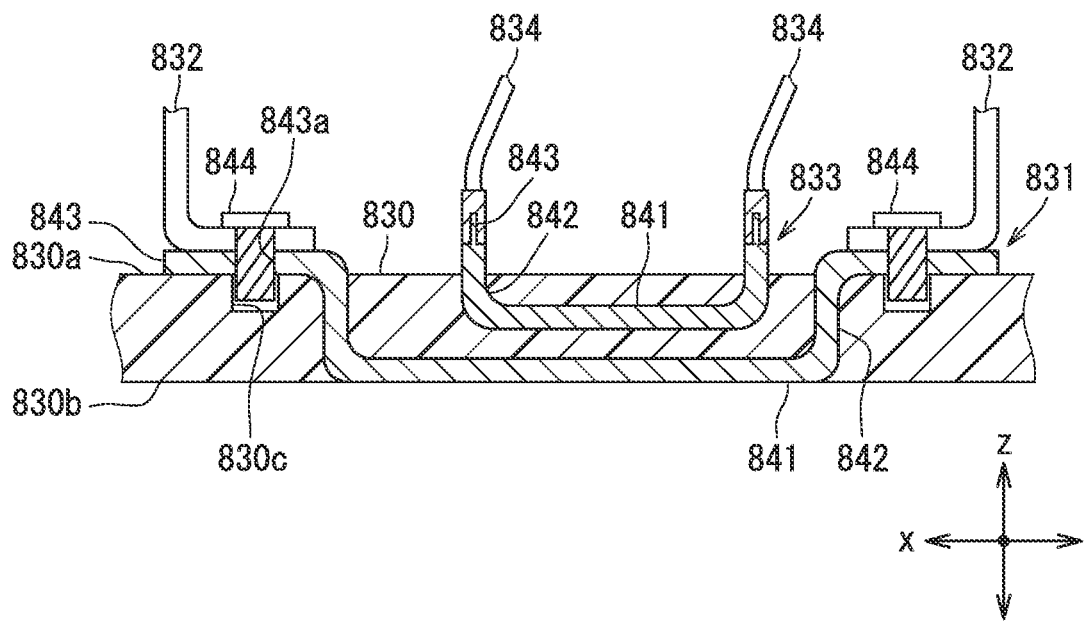
FIG. 5 is a partial cross-sectional view for explaining a resin part of the power distribution device according to a second embodiment.

Next, a second embodiment will be described with reference to FIG. 5.

In the first embodiment, an example in which the entire laid-out portion 841 of the covered power line 831 is covered with the resin part 830 is shown. In the present embodiment, on the other hand, a part of the laid-out portion 841 of the covered power line 831 is exposed from the resin part 830.

The laid-out portion 841 of the covered power line 831 is exposed from the mounting surface 830*b* of the resin part 830. Therefore, the exposed portion of the laid-out portion 841 is in direct contact with the heat transfer sheet 820. This facilitates heat transfer from the laid-out portion 841 to the heat transfer sheet 820.

The power distribution device 200 described in the present embodiment includes components similar to those of the power distribution device 200 described in the first embodiment. Therefore, it goes without saying that the power distribution device 200 of the present embodiment achieves the similar effects to those of the power distribution device 200 of the first embodiment. Therefore, the descriptions related to those effects will not be repeated. In the following descriptions of the other embodiments, the descriptions related to the similar effects will not be repeated.

(Third Embodiment)

Figure 6:
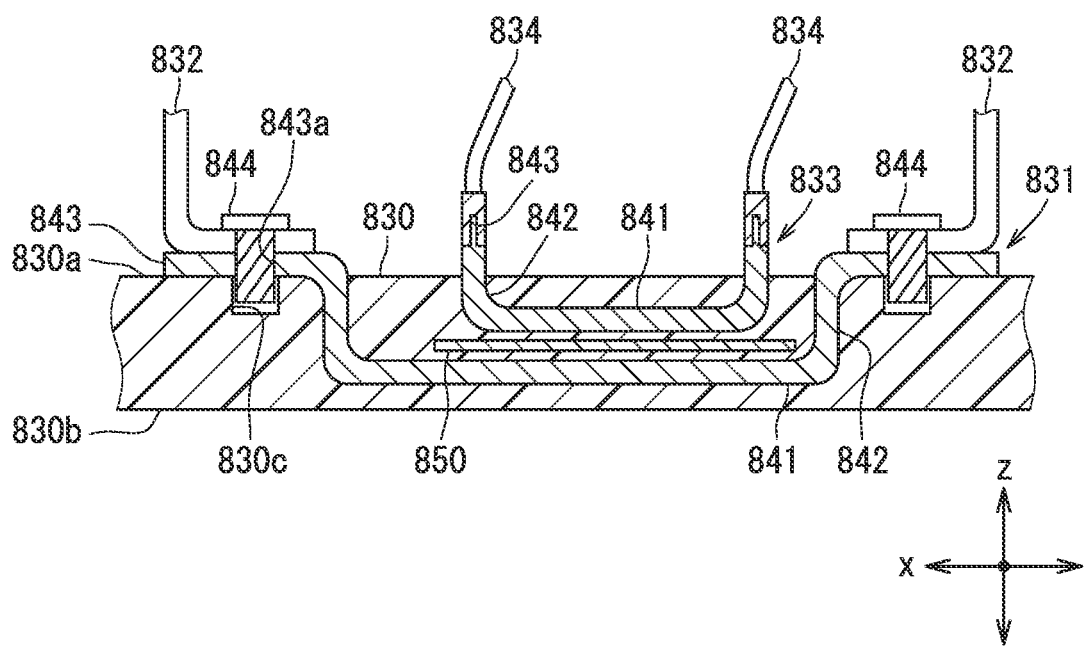
FIG. 6 is a partial cross-sectional view for explaining a resin part of a power distribution device according to a third embodiment.

Next, a third embodiment will be described with reference to FIG. 6.

In the first embodiment, an example in which the resin part 830 covers the power line and the signal line is shown. In the present embodiment, on the other hand, the resin part 830 covers a shield part 850 together with the power line and the signal line.

The shield part 850 is made of a material having a higher magnetic permeability than the resin part 830. As the forming material of the shield part 850, a metal material such as copper can be adopted. As shown in FIG. 6, the shield part 850 is embedded in the resin part 830 between the laid-out portion 841 of the covered power line 831 and the laid-out portion 841 of the covered signal line 833. The shield part 850 has a flat shape with a thin thickness in the z direction. The shield part 850 extends in the extending direction of the laid-out portion 841 of the covered signal line 833.

Due to such a configuration, electromagnetic noise output from the covered power line 831 is suppressed from passing through the covered signal line 833.

(Other Modifications)

In the present embodiment, an example in which the vehicle has both the front MG 400 and the rear MG 600 is shown. However, it is also possible to adopt a configuration in which the vehicle has one of the front MG 400 and the rear MG 600. When the vehicle has only one of these two MGs, the vehicle has only one of the front MG 400 and the rear MG 600.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A power distribution device comprising:
   a switch configured to control conduction and interception of a supplied power between a power supply and an electrical load;
   a control unit configured to turn on and off the switch according to a control signal having a voltage lower than the supplied power;
   a power line through which the supplied power flows;
   a signal line through which the control signals flows;
   a resin part covering a portion of the power line and a portion of the signal line, and in which the switch is disposed adjacent to one surface; and
   a cooling part disposed adjacent to a back surface of the resin part, the back surface being on a back side of the one surface of the resin part, wherein
   each of the power line and the signal line includes, inside the resin part, a laid-out portion extending in a planar direction orthogonal to an arrangement direction in which the one surface and the back surface are arranged, and a led-out portion extending from the laid-out portion toward the one surface, and
   the laid-out portion of the power line and the laid-out portion of the signal line are located in a projection area of the cooling unit projected in the arrangement direction, and are separated from each other and arranged in the arrangement direction.

2. The power distribution device according to claim 1, wherein
   the laid-out portion of the power line is located closer to the back surface than the laid-out portion of the signal line in the arrangement direction.

3. The power distribution device according to claim 1, wherein
   the laid-out portion of the power line and the laid-out portion of the signal line each have an overlapping area overlapping the projection area in the arrangement direction, and
   the overlapping area of the laid-out portion of the power line is larger than the overlapping area of the laid-out portion of the signal line.

4. The power distribution device according to claim 1, comprising:
   an insulating heat transfer sheet disposed between the resin part and the cooling part for facilitating heat conduction between the resin part and the cooling part.

5. The power distribution device according to claim 4, wherein
   a part of the laid-out portion of the power line is exposed from the back surface and is in contact with the heat transfer sheet.

6. The power distribution device according to claim 1, wherein
   the cooling part includes a channel to allow a cooling fluid to flow therein.

7. The power distribution device according to claim 1, comprising:
   a shield part having a magnetic permeability higher than that of the resin part, the shield part being interposed between the laid-out portion of the power line and the laid-out portion of the signal line in the arrangement direction.

* * * * *